(12) United States Patent
Tsuchiya et al.

(10) Patent No.: US 7,714,653 B2
(45) Date of Patent: May 11, 2010

(54) DIFFERENTIAL AMPLIFIER

(75) Inventors: Hirotoshi Tsuchiya, Fukuroi (JP);
Shinji Yaezawa, Hamamatsu (JP); Yuya Hashimoto, Hamamatsu (JP); Toru Nakamori, Hamamatsu (JP); Tatsuya Kishii, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 28 days.

(21) Appl. No.: 12/286,579

(22) Filed: Oct. 1, 2008

(65) Prior Publication Data
US 2009/0091386 A1    Apr. 9, 2009

(30) Foreign Application Priority Data
Oct. 1, 2007   (JP) .............................. 2007-258159

(51) Int. Cl.
*H03F 3/45* (2006.01)
(52) U.S. Cl. ..................... 330/253; 330/258; 330/255
(58) Field of Classification Search ................. 330/253, 330/258, 255
See application file for complete search history.

(56) References Cited

U.S. PATENT DOCUMENTS

| | | | |
|---|---|---|---|
| 4,623,851 A * | 11/1986 | Abou | 331/111 |
| 4,766,394 A * | 8/1988 | Yukawa | 330/253 |
| 6,483,384 B1 * | 11/2002 | Chimura | 330/257 |
| 7,095,272 B2 * | 8/2006 | Morishita | 327/541 |
| 7,335,872 B2 * | 2/2008 | Fukuda et al. | 250/214 A |
| 7,443,238 B2 * | 10/2008 | Laaser | 330/253 |

FOREIGN PATENT DOCUMENTS

JP    6-120746    4/1994

* cited by examiner

*Primary Examiner*—Patricia Nguyen
(74) *Attorney, Agent, or Firm*—Pillsbury Winthrop Shaw Pittman LLP

(57) ABSTRACT

A differential amplifier includes: a constant current source; first and second field effect transistors whose respective gates are imparted with positive-phase and negative-phase input signals and whose sources commonly connected to each other, the constant current source being connected to a common node of the sources; first and second loads serving as current paths for respective drain currents of the first and second field effect transistors; an amplifying unit which outputs positive-phase and negative-phase output signals which are amplified in response to the respective drain voltages of the first and second field effect transistors; and a current path generator which generates first and second current paths parallel to the respective first and second field effect transistors for a predetermined period of time at the time of start-up of the differential amplifier.

5 Claims, 4 Drawing Sheets

DIFFERENTIAL AMPLIFIER

BACKGROUND OF THE INVENTION

The present invention relates to a differential amplifier that performs differential amplification of two-phase input signals of differential-type having two a positive phase and a negative phase.

FIG. 4 is a circuit diagram showing an example configuration of an analogue circuit using a differential amplifier 1 that is an example related-art differential amplifier. In the illustrated example, a high potential power line of the differential amplifier 1 is connected to a power source of a source voltage AVDD, and a low potential power line of the same is connected to a ground. The differential amplifier 1 is broadly made up of a differential amplifying section 10 and source-grounded amplifying sections 20 and 30. The differential amplifying section 10 is made up of P channel field effect transistors 11 and 12 whose respective sources are commonly connected, to thus constitute a differential transistor pair; N channel field effect transistors 13 and 14 that act as loads of the transistors 11 and 12 and that constitute a current-mirror circuit; and a constant current source 15 that supplies the differential transistor pair with a constant current. Two-phase input signals Vip and Vin having positive and negative phases, subjected to differential amplification, are imparted to respective gates of the P channel field effect transistors 11 and 12.

The source-grounded amplifying section 20 is made up of an N channel field effect transistor 21 whose gate receives a drain voltage of the P channel field effect transistor 11 and whose source is connected to a ground; and a constant current source 22 that is interposed between the drain of the N channel field effect transistor 21 and the high potential power line. A voltage appearing at a node between the constant current source 22 and the drain of the N channel field effect transistor 21 acts as a positive phase output signal OP of the differential amplifier 1.

The source-grounded amplifying section 30 is made up of an N channel field effect transistor 31 whose gate receives a drain voltage of the P channel field effect transistor 12 and whose source is connected to a ground; and a constant current source 32 that is interposed between the drain of the N channel field effect transistor 31 and the high potential power line. A voltage appearing at a node between the constant current source 32 and the drain of the N channel field effect transistor 31 acts as a negative phase output signal ON of the differential amplifier 1.

In the illustrated example, an input terminal of the differential amplifier 1 for the positive phase input signal IP is connected to one end of an input resistor 41, and an input terminal of the differential amplifier 1 for the negative phase input signal IN is connected to one end of an input resistor 42, in which the input resistors 41 and 42 have the same resistance value. A feedback resistor 51 is interposed between an output terminal of the differential amplifier 1 for the negative phase output signal ON and the input terminal for the positive phase input signal IP. A feedback resistor 52 having the same resistance value as that of the feedback resistor 51 is interposed between an output terminal of the differential amplifier 1 for the positive phase output signal OP and the input terminal for the negative phase input signal IN.

In the foregoing configuration, the other terminal of the input resistor 41 is applied with the positive phase input signal Vip, and the other terminal of the input resistor 42 is applied with the negative phase input signal Vin. For instance, provided that a value of AVDD/2 is taken as an in-phase level, the input signals Vip and Vin are balanced differential signals that are symmetrical about the in-phase level. Since negative feedback acts on an illustrated analogue circuit by way of the resistors 51 and 52, the differential amplifier 1 differentially amplifies the input signals Vip and Vin in a state of virtually grounding the respective input terminals for the positive phase input signal IP and the negative phase input signal IN at the in-phase level; and outputs the positive phase output signal OP and the negative phase output signal ON that are results of amplification.

Incidentally, in the analogue circuit, such as that exemplified in FIG. 4, when operation of the entire circuit, including the differential amplifier 1 and a previous stage circuit (omitted from the drawings), is stable, the input signals Vip and Vin, which are symmetrical about the in-phase level, are imparted from the previous stage circuit to the differential amplifier 1. However, for instance, upon start-up of the overall analogue circuit, there is a case where the input signals Vip and Vin applied from the previous stage circuit to the differential amplifier 1 rise to a voltage close to, for instance, the source voltage AVDD, in excess of an in-phase input range that is a voltage range of an input signal where differential amplification is possible. In such a case, both the P channel field effect transistors 11 and 12 are turned off, and supply of current to the N channel field effect transistors 13 and 14 is interrupted. Therefore, N channel field effect transistors 13 and 14 are not turned on and remain in an OFF state. The respective drains of the P channel field effect transistors 11 and 12 enter a floating state, and voltages of the respective drains come close to 0V. For this reason, both the N channel field effect transistors 21 and 31 are turned off, and both the positive phase output signal OP and the negative phase output signal ON come close to the source voltage AVDD, thereby the positive phase output signal OP and the negative phase output signal ON are positively fed back to the respective input terminals for the negative phase input signal IN and the positive phase input signal IP. Due to this positive feedback, the negative phase input signal IN and the positive phase input signal IP are maintained in the vicinity of the source voltage AVDD. Once the analogue circuitry has entered such a state, there arises a problem of a time being consumed before the differential amplifier 1 gets out of an anomalous operating state and initiates normal differential amplification even when the input signals Vip and Vin applied from the previous stage circuit to the differential amplifier 1 subsequently assume normal waveforms that are symmetrical about the in-phase level.

SUMMARY OF THE INVENTION

The present invention has been conceived in the view of the circumstance and aims at providing a differential amplifier that can avoid entering an anomalous operating state, where differential amplification is not performed, for a long period of time even when input signals exceeding an in-phase input range are imparted.

The present invention provides a differential amplifier comprising:

a constant current source;

first and second field effect transistors whose respective gates are imparted with positive-phase and negative-phase input signals and whose sources commonly connected to each other, the constant current source being connected to a common node of the sources;

first and second loads serving as current paths for respective drain currents of the first and second field effect transistors;

an amplifying unit which outputs positive-phase and negative-phase output signals which are amplified in response to the respective drain voltages of the first and second field effect transistors; and a current path generator which generates first and second current paths parallel to the respective first and second field effect transistors for a predetermined period of time at the time of start-up of the differential amplifier.

In such a differential amplifier, first and second current paths parallel to the first and second field effect transistors are formed at start-up of the differential amplifier for a predetermined period of time. Accordingly, even when the first and second field effect transistor are turned off as a result of being imparted with input signals exceeding an in-phase input range at the time of start-up, an electric current flows to the first and second loads by way of the first and second current paths, thereby preventing respective drains of the first and second field effect transistors from entering a floating state. Therefore, the differential amplifier is prevented from entering an anomalous state where differential amplification is not performed.

In another embodiment, the present invention provides a differential amplifier comprising:

a constant current source;

first and second field effect transistors whose respective gates are imparted with positive-phase and negative-phase input signals and whose sources commonly connected to each other, the constant current source being connected to a common node of the sources;

first and second loads serving as current paths for respective drain currents of the first and second field effect transistors;

an amplifying unit which outputs positive-phase and negative-phase output signals which are amplified in response to the respective drain voltages of the first and second field effect transistors;

a third field effect transistor whose source and drain are connected respectively to a source and a drain of the first field effect transistor; and a fourth field effect transistor whose source and drain are connected respectively to a source and a drain of the second field effect transistor, wherein a voltage, which falls within an in-phase input range of the differential amplifier and which is close to an upper limit or lower limit of the in-phase input range, is imparted to the respective gates of the third and fourth field effect transistors.

In such a differential amplifier, when the first and second field effect transistors are turned off as a result of being imparted with input signals exceeding the in-phase input range, there is decreased a drop in the voltage of the constant current source having lost a destination to which an output current is to be supplied. As a result, a voltage between the gates and sources of the third and fourth field effect transistors is increased, thereby the third and fourth field effect transistors enter an ON state. The respective drains of the first and second field effect transistors are hereby prevented from entering a floating state. Therefore, the differential amplifier is prevented from entering an anomalous operating state where differential amplification is not performed.

The differential amplifier mentioned above may also be additionally provided with a minute current supply unit that feeds a minute current at all times to the respective first and second loads. In this mode, a minute current flows to the first and second loads at all times. Accordingly, in a phase other than the startup of the differential amplifier, when both the first and second field effect transistors are turned off as a result of being imparted with input signals exceeding the in-phase input range under influence of disturbance, such as noise, the respective drains of the first and second field effect transistors avoid entering a floating state, thereby preventing the differential amplifier from entering an anomalous state where differential amplification is not performed.

DETAILED DESCRIPTION OF PREFERRED EMBODIMENTS

An embodiment of the present invention will be described hereunder with reference to the drawings.

Figure 1:
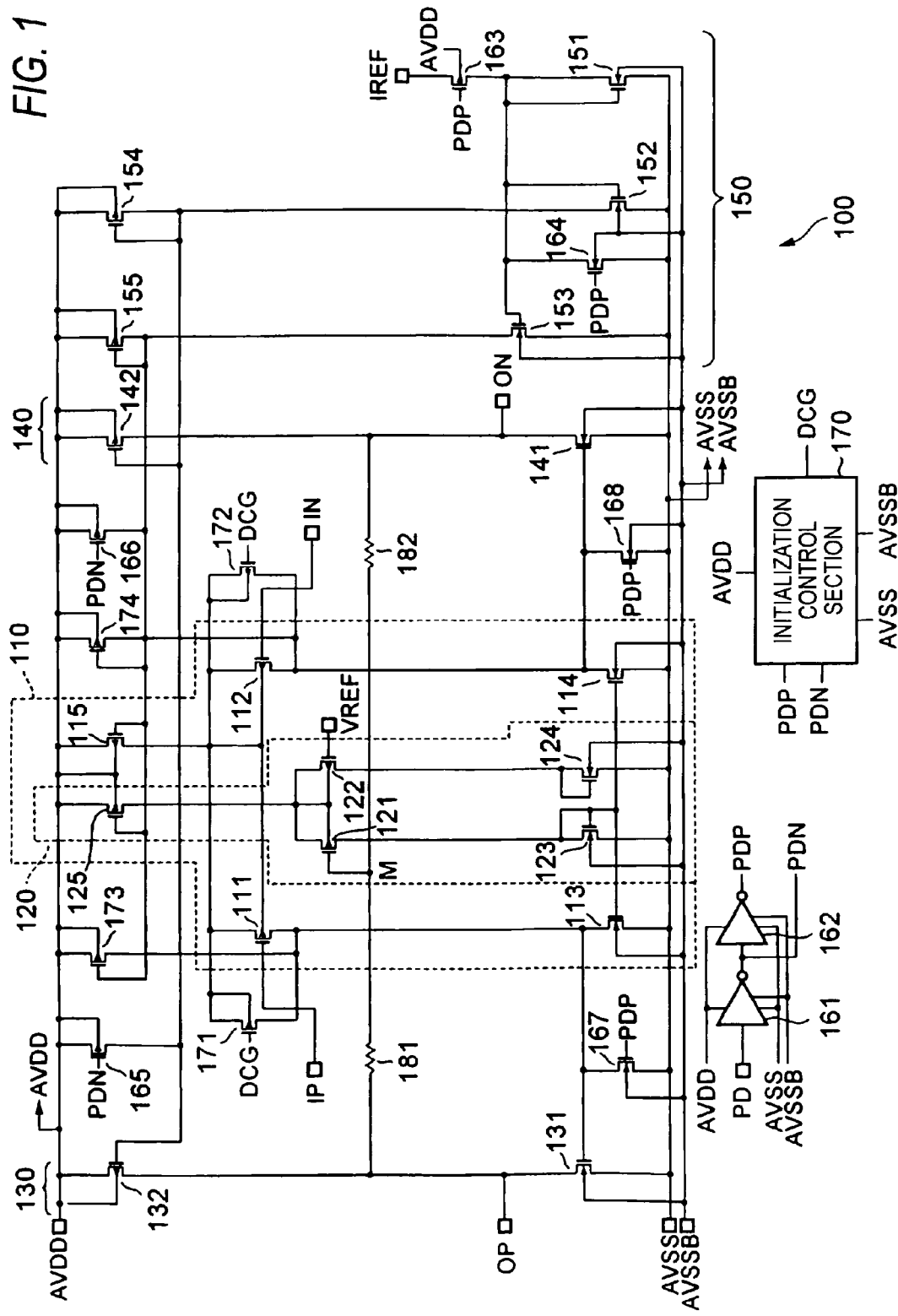
FIG. 1 is a circuit diagram showing the configuration of a differential amplifier 100 according to an embodiment of the present invention.

FIG. 1 is a circuit diagram showing the configuration of a differential amplifier 100 according to an embodiment of the present invention. As shown in FIG. 1, the differential amplifier 100 of the present embodiment is made up of P channel filed effect transistors and N channel field effect transistors. Of all P channel field effect transistors constituting the differential amplifier 100, P channel field effect transistors 111, 112, 121, 122, 171, and 172 have back gates as back regions for respective sources and drains (N wells for the case of the P channel field effect transistors) and that are respectively connected to the sources. This is intended for preventing occurrence of a substrate bias effect; namely, an increase in a threshold value of a field effect transistor induced depending on a voltage between the back gate and the source. Back gates of the other P channel field effect transistors are fixed to a high potential source voltage AVDD. In all N channel field effect transistors constituting the differential amplifier 100, respective sources of the transistors are fixed to a low potential source voltage AVSS, and respective back gates of the transistors are connected to a low potential source voltage AVSSB. The low potential source voltages AVSS and AVSSB are usually provided with the same voltage.

As shown in FIG. 1, the differential amplifier 100 includes two differential amplifying sections 110 and 120 and two source-grounded amplifying sections 130 and 140. The differential amplifying section 110 is a circuit that differentially amplifies two-phase input signals IP and IN that have positive and negative phases and that are applied from the outside. The differential amplifying section 110 is built up of the P channel field effect transistors 111 and 112, the N channel field effect transistors 113 and 114, and the P channel field effect transistor 115. The P channel field effect transistors 111 and 112 constitute a differential transistor pair, in which respective sources of the transistors are commonly connected, and respective gates of the respective transistors are imparted with the positive phase input signal IP and the negative phase input signal IN. The P channel field effect transistor 115 is interposed between a common node for the respective sources of the P channel field effect transistors 111 and 112 and a power line for supplying the high potential source voltage AVDD, and acts as a constant current source for supplying the differential transistor pair with a current. Respective drains of the N channel field effect transistors 113 and 114 are connected to respective drains of the P channel field effect transistors 111 and 112, thereby acting as loads for the P channel field effect transistors 111 and 112.

In such a configuration, when a voltage value of the positive phase input signal IP becomes smaller than a voltage value of the negative phase input signal IN, an increase in a drain current of the P channel field effect transistor 111 and a decrease in a drain current of the P channel field effect transistor 112 are induced in accordance with a voltage difference between the signals IP and IN, thereby a drain voltage of the P channel field effect transistor 111 and a decrease in a drain voltage of the P channel field effect transistor 112 arise increases. Conversely, when the voltage value of the positive phase input signal IP becomes larger than the voltage value of the negative phase input signal IN, a decrease in the drain current of the P channel field effect transistor 111 and an increase in the drain current of the P channel field effect transistor 112 are induced in accordance with the voltage difference between the signals IP and IN, thereby the drain voltage of the P channel field effect transistor 111 and an increase in the drain voltage of the P channel field effect transistor 112 decreases.

The source-grounded amplifying section 130 is made up of a P channel field effect transistor 132 and an N channel field effect transistors 131 that are serially interposed between the power line for supplying the high potential source voltage AVDD and the power line for supplying the low potential source voltage AVSS. The drain voltage of the P channel field effect transistor 111 in the differential amplifying section 110 is applied to the gate of the N channel field effect transistor 131, and the drain voltage of the N channel field effect transistor 131 turns into the positive phase output signal OP of the differential amplifier 100. The source-grounded amplifying section 140 is also made up of a P channel field effect transistor 142 and an N channel field effect transistor 141 analogous to the counterpart field effect transistors of the source-grounded amplifying section 130. The drain voltage of the P channel field effect transistor 112 in the differential amplifying section 110 is applied to a gate of the N channel field effect transistor 141, and the drain voltage of the N channel field effect transistor 141 turns into the negative phase output signal ON of the differential amplifier 100.

Resistors 181 and 182 having the same resistance value are interposed in series between the drain of the N channel field effect transistor 131 of the source-grounded amplifying section 130 and the drain of the N channel field effect transistor 141 of the source-grounded amplifying section 140. A voltage M that is a center point between the positive phase output signal OP and the negative phase output signal ON is developed at a node between the resistors 181 and 182.

The differential amplifying section 120 is made up of the P channel field effect transistors 121 and 122, the N channel field effect transistors 123 and 124, and the P channel field effect transistor 125. Respective sources of the P channel field effect transistors 121 and 122 are commonly connected, whereby the transistors constitute a differential transistor pair. The voltage M that is the center point between the positive phase output signal OP and the negative phase output signal ON is imparted from the node between the resistors 181 and 182 to the gate of the P channel field effect transistor 121. Further, an in-phase level VREF of the positive phase input signal IP and the negative phase input signal IN is applied to the gate of the P channel field effect transistor 122 from the outside of the differential amplifier 100. The P channel field effect transistor 125 is interposed between a common node for the respective sources of the P channel field effect transistors 121 and 122 and the power line for supplying the high potential source voltage AVDD; and acts as a constant current source for supplying the differential transistor pair with a current. Respective drains and gates of the N channel field effect transistors 123 and 124 are connected to the respective drains of the P channel field effect transistors 121 and 122, thereby acting as loads on the P channel field effect transistors 121 and 122. The drain voltage (=a gate voltage) of the N channel field effect transistor 123 is applied as a gate voltage to the N channel field effect transistors 113 and 114 of the differential amplifying section 110.

In the differential amplifying section 120, when the voltage M at the center point between the positive phase output signal OP and the negative phase output signal ON is lower than the in-phase level VREF of the input signals IP and IN, the drain current of the P channel field effect transistor 121 increases, and the gate voltages of the N channel field effect transistors 113 and 114 of the differential amplifying section 110 also increase, thereby the level of the positive phase output signal OP and the level of the negative phase output signal ON shift go toward the high potential source voltage AVDD. Conversely, when the voltage M at the center point between the positive phase output signal OP and the negative phase output signal ON is higher than the in-phase level VREF of the input signals IP and IN, the drain current of the P channel field effect transistor 121 decreases, and the gate voltages of the N channel field effect transistors 113 and 114 of the differential amplifying section 110 also decrease, thereby the level of the positive phase output signal OP and the level of the negative phase output signal ON shifts to the low potential source voltage AVSS. Thus, the differential amplifying section 120 plays a role of controlling the gate voltage applied to the N channel field effect transistors 113 and 114 of the differential amplifying section 110 in such a way that the voltage M at the center point between the positive phase output signal OP and the negative phase output signal ON output from the differential amplifying section 110 coincides with the in-phase level VREF of the input signals IP and IN.

A constant current control circuit 150 is a circuit that applies a given gate voltage to P channel field effect transistors 115, 125, 132, 142, 173, and 174, thereby causing the P channel field effect transistors to act as constant current sources. In the constant current control circuit 150, a gate and a drain of the N channel field effect transistor 151 are commonly connected, and a constant current IREF is applied from a constant current source located outside the differential amplifier 100 to the gate and the drain by way of the P channel field effect transistor 163. The gate voltage identical with that applied to the N channel field effect transistor 151 is applied to respective gates of the N channel field effect transistors 152 and 153. Respective sources of the P channel field effect transistors 154 and 155 are connected to the power line that supplies the high potential source voltage AVDD, and respective drains and gates of the transistors are connected to respective drains of the N channel field effect transistors 152 and 153.

In the configuration, the gate voltage identical with that applied to the N channel field effect transistor 151 is applied to the N channel field effect transistors 152 and 153, and hence a drain current proportional to the constant current IREF flows to the N channel field effect transistors 152 and 153. Drain currents of the N channel field effect transistors 152 and 153 flow to the P channel field effect transistors 154 and 155, respectively. The gate voltage identical with the gate voltage applied to the P channel field effect transistor 154 is applied at this time to the P channel field effect transistors 132 and 142, and the gate voltage identical to the gate voltage applied to the P channel field effect transistor 155 is applied to the P channel field effect transistors 115, 125, 173, and 174. Accordingly, a constant current proportional to the constant current IREF flows to the P channel field effect transistors 115, 125, 132, 142, 173, and 174. The magnitude of the constant current flowing to the P channel field effect transistors 115, 125, 132, 142, 173, and 174 is determined by a ratio among the sizes of the respective transistors interposed between the N channel field effect transistor 151 and these respective P channel field effect transistors.

The inverters 161 and 162, the P channel field effect transistors 163, 165, and 166, and the N channel field effect transistors 164, 167, and 168 constitute a circuit that brings the differential amplifier 100 into a power-down state where power consumption is extremely small by means of forcefully driving into an OFF state the field effect transistors constituting the constant current source in the differential amplifier 100 and the field effect transistors that perform amplifying operation.

In more detail, the inverter 161 inverts the level of a power-down instruction signal PD provided from the outside of the differential amplifier 100, thereby outputting a power-down instruction signal PDN. The inverter 162 inverts the level of the power-down instruction signal PDN, thereby outputting a power-down instruction signal PDP having the same logical value as that of the power-down instruction signal PD. The P channel field effect transistor 165 is interposed between the gates and sources of the respective P channel field effect transistors 132 and 142 and imparted with the power-down instruction signal PDN as a gate voltage. The P channel field effect transistor 166 is interposed between the gates and sources of the respective P channel field effect transistors 115, 125, 173, and 174 and imparted with, as a gate voltage, the power-down instruction signal PDN. The N channel field effect transistors 167 and 168 are interposed between the gate and sources of the respective N channel field effect transistors 131 and 141 and imparted with the power-down instruction signal PDP as a gate voltage. The P channel field effect transistor 163 is interposed in a path for the drain current of the N channel field effect transistor 151 and imparted with the power-down instruction signal PDP as a gate voltage. The N channel field effect transistor 164 is interposed between the gates and sources of the respective N channel field effect transistors 152 and 153 and imparted with the power-down instruction signal PDP as a gate voltage.

In such a configuration, when the power-down instruction signal PD reaches an H level (an active level), the power-down instruction signal PDN goes to an L level (an active level), and the power-down instruction signal PDP reaches an H level (an active level). In this state, the P channel field effect transistor 165 is turned on, so that the P channel field effect transistors 132 and 142 are turned off. Further, since the P channel field effect transistor 166 is turned on, the P channel field effect transistors 115, 125, 173, and 174 are turned off. Moreover, the respective N channel field effect transistors 167 and 168 are turned on, the N channel field effect transistors 131 and 141 are respectively turned off. Since the P channel field effect transistor 163 is also turned off, the drain current of the N channel field effect transistor 151 is interrupted. Further, the N channel field effect transistor 164 is turned on, and hence the N channel field effect transistors 152 and 153 are turned off.

The differential amplifier 100 of the present embodiment includes P channel field effect transistors 171 and 172 and an initialization control section 170. A source and a drain of the P channel field effect transistor 171 are connected respectively to the source and drain of the P channel field-effect transistor 111 of the differential amplifying section 110. A source and a drain of the P channel field effect transistor 172 are connected respectively to the source and drain of the P channel field effect transistor 112. The initialization control section 170 is a circuit that generates a gate voltage DCG for driving the P channel field effect transistors 171 and 172 into an ON state for a predetermined period of time at the time of start-up of the differential amplifier 100; specifically, at the time of rise of the source voltage AVDD or when the power-down instruction signals PDP and PDN go from an active level to a nonactive level. Specifically, in the present embodiment, upon start-up of the differential amplifier 100, the P channel field effect transistors 171 and 172 and the initialization control section 170 act, for a predetermined period of time, as a current path generator that forms first and second current channels in parallel with the respective P channel field effect transistors 111 and 112. A first characteristic of the present embodiment lies in the current path generator.

The differential amplifier 100 of the present embodiment has P channel field effect transistors 173 and 174. Respective sources of the P channel field effect transistors 173 and 174 are connected to the power line that supplies the high potential source voltage AVDD, and respective drains of the P channel field effect transistors 173 and 174 are connected to respective drains of the N channel field effect transistors 113 and 114, thereby constituting a current mirror along with the P channel field effect transistor 155 of the constant current control circuit 150. The P channel field effect transistors 173 and 174 serve as a minute current supply unit that has a longer channel length and a narrower channel width than those of the P channel field effect transistor 115 serving as the constant current source of the differential amplifying section 110 and that respectively supplies the N channel field effect transistors 113 and 114 with a minute constant current that is minuter than the constant current output from the P channel field effect transistor 115. The minute current supplied from the P channel field effect transistors 173 and 174 to the N channel field effect transistors 113 and 114 prevents the N channel field effect transistors 131 and 141 from being turned off. A second characteristic of the present embodiment lies in the P channel field effect transistors 173 and 174 that cause the minute current to flow into the N channel field effect transistors 113 and 114 at all times, thereby preventing deactivation of the N channel field effect transistors 131 and 141.

Operation of the analogue circuit of the present embodiment is now described by means of a specific example. In the analogue circuit shown in FIG. 2, at least the differential amplifier 100B of the differential amplifiers 100A and 100B is a differential amplifier that has the same configuration as that of the differential amplifier 100 of the present embodiment. An output signal ON from the differential amplifier 100A in a previous stage (hereinafter called a "previous differential amplifier) is input to the differential amplifier 100B in a subsequent stage (hereinafter called a "subsequent differential amplifier") as an input signal IP by way of a capacitor 201 and an input resistor 202. The output signal OP from the previous differential amplifier 100A is input, as an input signal IN, to the subsequent differential amplifier 100B by way of the capacitor 203 and the input resistor 204. Output signals ON and OP from the subsequent differential amplifier 100B are fed back to respective input terminals where the input signals IP and IN are input, by way of feedback resistors 205 and 206.

Figure 2:
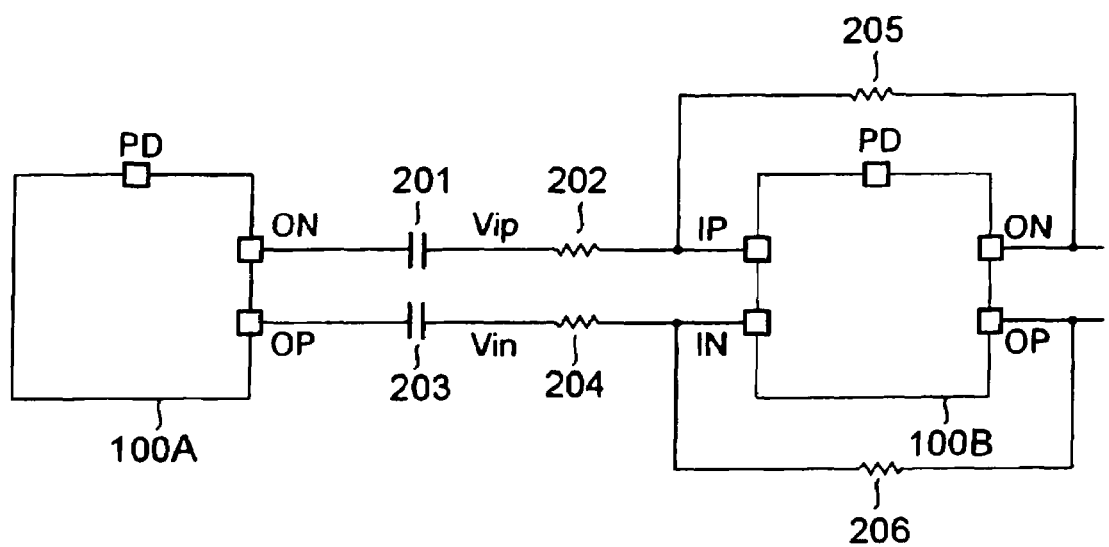
FIG. 2 is a circuit diagram showing an example configuration of an analogue circuit using the differential amplifier 100.
Figure 3:
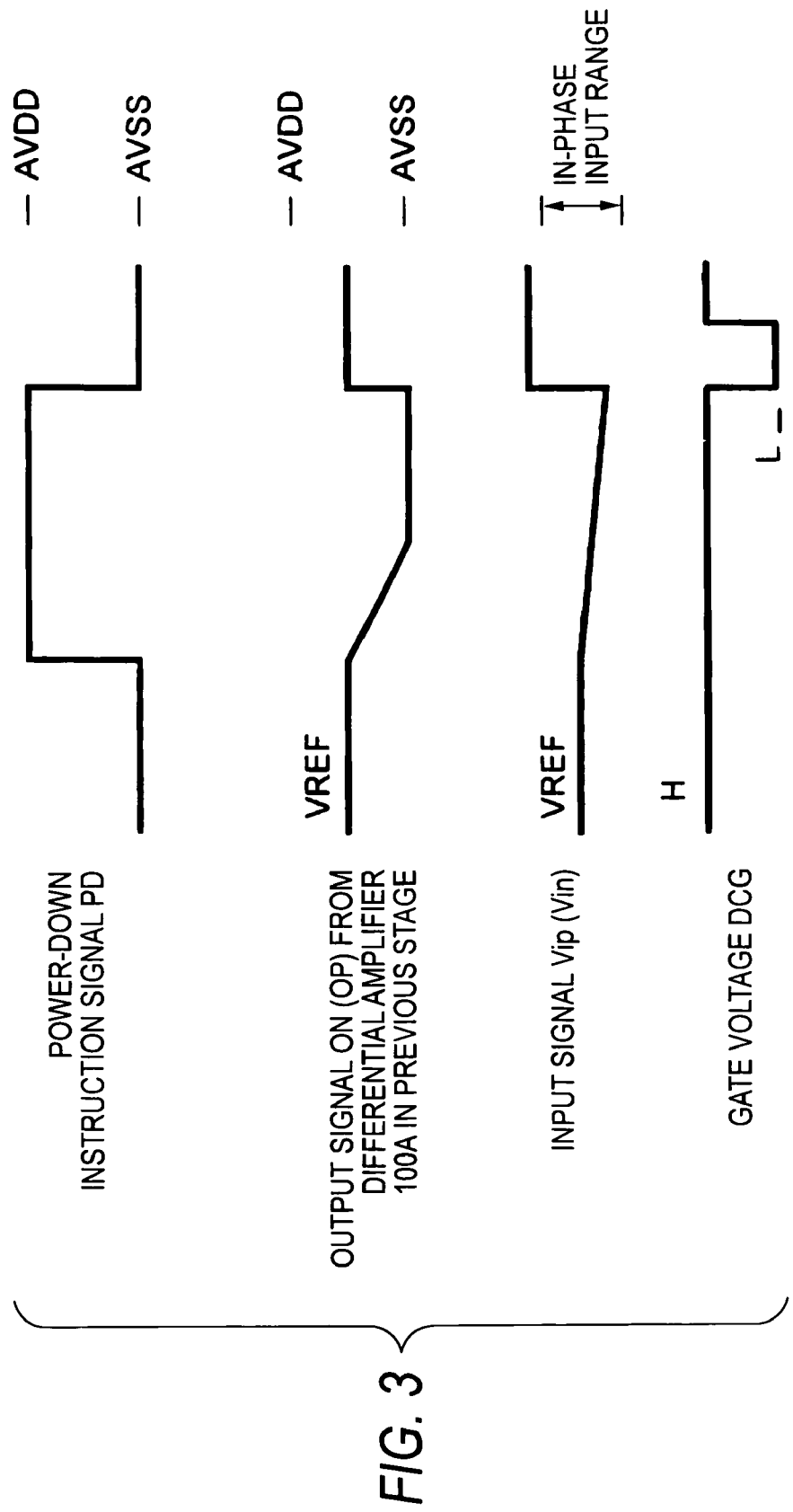
FIG. 3 is a waveform chart showing waveforms of respective sections acquired when a power-down instruction signal PD applied to a differential amplifier 100A in a previous stage stage and a differential amplifier 100B in a subsequent stage in the analogue circuit is temporarily brought to an active level.

FIG. 3 shows waveforms of respective sections in the analogue circuit shown in FIG. 2 acquired when the power-down instruction signal PD input to the previous differential amplifier 100A and the subsequent differential amplifier 100B has temporarily reached an active level. As shown in FIG. 3, when the power-down instruction signal PD reaches the active level, the N channel field effect transistors 131 and 141 and the P channel field effect transistors 132 and 142 in the previous differential amplifier 100A go into an OFF state (see FIG. 1). Therefore, an in-phase level of the output signals OP and ON of the previous differential amplifier 100A gradually goes out of the in-phase level VREF that ought to be originally assumed, to thus come to a level close to; for instance, the low potential source voltage AVSS.

Subsequently, when the power-down instruction signal PD input to the previous differential amplifier 100A reaches a nonactive level, an in-phase level of the output signals OP and ON of the previous differential amplifier 100A rises to the in-phase level VREF that ought to be originally assumed. At this time, when the capacitors 201 and 203 are charged with electric charges, voltages of the capacitors 201 and 203 are additionally superimposed on the output signals OP and ON from the previous differential amplifier 100A. Hence, the input signals Vip and Vin imparted to the input resistors 202 and 204 of the subsequent differential amplifier 100B increase in excess of the in-phase input range of the differential amplifier 100B. The input signals IP and IN to the differential amplifier 100B also hereby exceed the in-phase input range.

Figure 4:
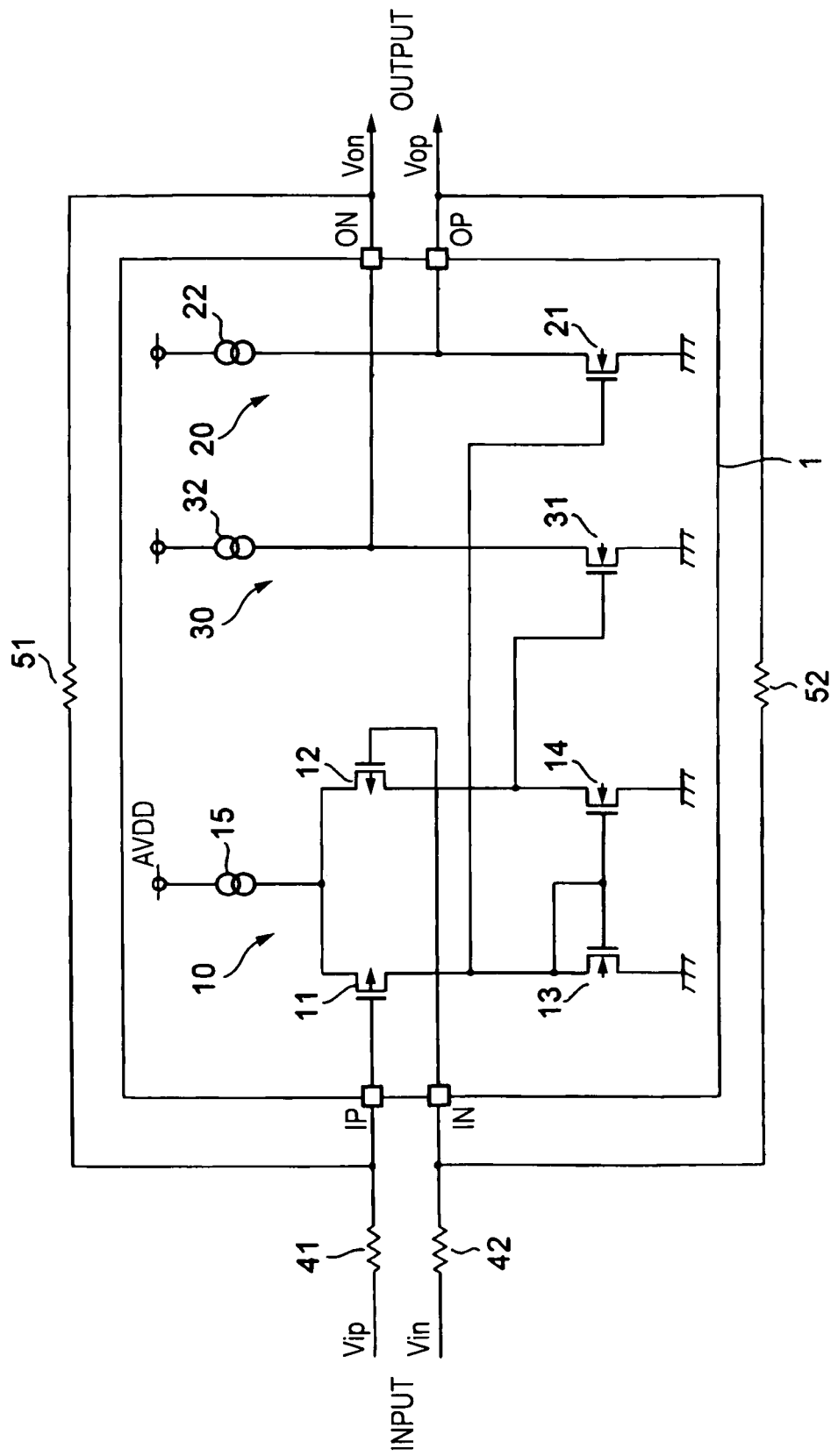
FIG. 4 is a circuit diagram showing the configuration of a differential amplifier 1 as an example related-art differential amplifier.

In such a case, provided that the subsequent differential amplifier 100B is like the related differential amplifier 1 described in the background of the invention, the subsequent differential amplifier 100B is imparted with the input signals IP and IN that exceed the in-phase input range, so that both the P channel field effect transistors 11 and 12 are turned off and that the differential amplifier 100B enters an anomalous state where differential amplification is not performed. Moreover, positive feedback for maintaining the negative-phase input signal IN and the positive-phase input signal IP are maintained in the vicinity of the source voltage AVDD (see FIG. 4) Once the differential amplifier 100B has entered the state where such positive feedback keeps active, even when the input signals Vip and Vin imparted from the previous differential amplifier 100A to the input resistors 202 and 204 assume normal waveforms, a time is consumed before the differential amplifier 100B returns to an operating state where normal amplification is performed.

However, in a case where the subsequent differential amplifier 100B is the differential amplifier 100 according to the present embodiment, when the power-down instruction signal PD reaches a nonactive level, the initialization control section 170 in the subsequent differential amplifier 100B generates, for a predetermined period of time, the gate voltage DCG that drives the P channel field effect transistors 171 and 172 into an ON state. As a result, first and second current paths parallel to the respective P channel field effect transistors 111 and 112 are formed. Accordingly, even when the P channel field effect transistors 111 and 112 are brought into an OFF state as a result of being imparted with the input signals IP and IN that exceed the in-phase input range, the drain current of the P channel field effect transistor 115 serving as a constant current source is divided into the first and second current paths, to thus flow into the N channel field effect transistors 113 and 114. Therefore, the respective drains of the P channel field effect transistors 111 and 112 do not enter a floating state, thereby preventing the N channel field effect transistor 131 and 141 from entering an OFF state.

Even when the input signals Vip and Vin temporarily exceed the in-phase input range at the time of start-up, in the differential amplifier 100B the respective drains of the P channel field effect transistors 111 and 112 avoid entering the floating state and the N channel field effect transistors 131 and 141 avoid entering an OFF state. Therefore, when the input signals Vip and Vin later assume normal waveforms that are symmetrical about the in-phase level VREF, the subsequent differential amplifier 100B immediately starts normal differential amplification.

In the present embodiment, a minute electric current flows to the N channel field effect transistors 113 and 114 at all times by way of the P channel field effect transistors 173 and 174. Therefore, even when the input signals Vip and Vin temporarily exceed the in-phase input range under influence of noise, or the like, at times other than the time of startup, in the differential amplifier 100B the drains of the P channel field effect transistors 111 and 112 avoid entering a floating state, and the N channel field effect transistors 131 and 141 avoid entering an OFF state. Accordingly, when disturbance, such as noise, disappears, the subsequent differential amplifier 100B immediately starts normal differential amplification.

Although the embodiment of the present invention has been described above, other various embodiments of the present invention, for instance, are also conceivable as follows.

(1) In the present embodiment, the differential transistor pair of the differential amplifying section 110 is made up of the two P channel field effect transistors 111 and 112. However, the differential transistor pair may also be made up of two N channel field effect transistors, a constant current source may also be interposed between a common node for respective sources of the N channel field effect transistors and the low potential power line, and a P channel field effect transistor serving as an active load may also be interposed between respective drains of the N channel field effect transistors and a high potential power line. In this case, the essential requirement is to connect the two N channel field effect transistors serving as the foregoing first and second current paths in parallel to the two N channel field effect transistors and to activate two N channel field effect transistors, which serve as the first and second current paths at the time of startup of the differential amplifier, for only a predetermined period of time.

(2) In the present embodiment, the initialization control section 170 holds the P channel field effect transistors 171 and 172, which serve as the first and second current paths at the time of startup of the differential amplifier 100, in an ON state for a predetermined period of time. However, voltages of the respective gates of the P channel field effect transistors 171 and 172 may also be instead fixed to voltages that are slightly lower than the upper limit of the in-phase input range of the differential amplifier 100 without provision of the initialization control section 170.

In this case, when the P channel field effect transistors 111 and 112 enter an OFF state as a result of being imparted with the input signals IP and IN that exceed the in-phase input range, an operating point of the P channel field effect transistor 115 serving as a constant current source which has lost a destination to which the drain current is to be supplied moves from a saturation range to a non-saturation range, thereby a voltage between the drain and source of the P channel field effect transistor 115 decreases. A voltage between the gates and sources of the P channel field effect transistors 171 and 172 hereby increases, to thus drive the P channel field effect transistors 171 and 172 into an ON state. Thus, the respective drains of the P channel field effect transistors 111 and 112 avoid entering the floating state. Therefore, the differential amplifier 100 is prevented from entering an anomalous operating state where differential amplification is not performed.

When the differential transistor pair is made up of the N channel field effect transistors, the essential requirement is to connect the N channel field effect transistors, which are to serve as the first and second current paths, in parallel to the respective transistors of the differential transistor pair as mentioned in (1); and to apply a gate voltage, which is slightly higher than a lower limit value of the in-phase input range, to the respective gates of the N channel field effect transistors that are to serve as the first and second current paths.

What is claimed is:

1. A differential amplifier comprising:
   a constant current source;
   first and second field effect transistors whose respective gates are imparted with positive-phase and negative-phase input signals and whose sources commonly connected to each other, the constant current source being connected to a common node of the sources;
   first and second loads serving as current paths for respective drain currents of the first and second field effect transistors;
   an amplifying unit which outputs positive-phase and negative-phase output signals which are amplified in response to the respective drain voltages of the first and second field effect transistors; and
   a current path generator which generates first and second current paths parallel to the respective first and second field effect transistors for a predetermined period of time at the time of start-up of the differential amplifier.

2. The differential amplifier according to claim 1, wherein the current path generator includes:
   a third field effect transistor whose source and drain are connected respectively to a source and a drain of the first field effect transistor;
   a fourth field effect transistor whose source and drain are connected respectively to a source and a drain of the second field effect transistor; and
   an initialization controller that, upon detection of start-up of the differential amplifier, imparts respective gates of the third and fourth field effect transistors with a gate voltage that holds the third and fourth field effect transistors in an on state for a predetermined period of time.

3. The differential amplifier according to claim 1 further comprising a minute current supply unit that respectively supplies a minute current at all times to the respective first and second loads.

4. A differential amplifier comprising;
   a constant current source;
   first and second field effect transistors whose respective gates are imparted with positive-phase and negative-phase input signals and whose sources commonly connected to each other, the constant current source being connected to a common node of the sources;
   first and second loads serving as current paths for respective drain currents of the first and second field effect transistors;
   an amplifying unit which outputs positive-phase and negative-phase output signals which are amplified in response to the respective drain voltages of the first and second field effect transistors;
   a third field effect transistor whose source and drain are connected respectively to a source and a drain of the first field effect transistor; and
   a fourth field effect transistor whose source and drain are connected respectively to a source and a drain of the second field effect transistor,
   wherein a voltage, which falls within an in-phase input range of the differential amplifier and which is close to an upper limit or lower limit of the in-phase input range, is imparted to the respective gates of the third and fourth field effect transistors.

5. The differential amplifier according to any claim 4 further comprising a minute current supply unit that respectively supplies a minute current at all times to the respective first and second loads.

* * * * *